United States Patent [19]
Ovens et al.

[11] Patent Number: 5,376,845
[45] Date of Patent: Dec. 27, 1994

[54] APPARATUS AND METHOD FOR ECL-LIKE SIGNAL TO CMOS SIGNAL CONVERSION

[75] Inventors: Kevin M. Ovens, Garland; Robert A. Helmick, Allen, both of Tex.

[73] Assignee: Texas Instruments Incorporated, Dallas, Tex.

[21] Appl. No.: 215,166

[22] Filed: Mar. 18, 1994

Related U.S. Application Data

[63] Continuation of Ser. No. 976,717, Nov. 16, 1992, abandoned, which is a continuation of Ser. No. 722,991, Jun. 28, 1991, abandoned.

[51] Int. Cl.⁵ .................................. H03K 19/0175
[52] U.S. Cl. .................................. 326/66; 326/21; 326/110
[58] Field of Search ............... 307/446, 455, 475, 443

[56] References Cited

U.S. PATENT DOCUMENTS

| | | | |
|---|---|---|---|
| 4,754,171 | 6/1988 | Dasai et al. | 307/455 |
| 4,794,283 | 12/1988 | Allen et al. | 307/475 |
| 4,800,300 | 1/1989 | Walters, Jr. | 307/272.2 |
| 4,806,799 | 2/1989 | Pelley, III et al. | 307/475 |
| 4,939,384 | 7/1990 | Shikata | 307/272.2 |
| 4,992,681 | 2/1991 | Urakawa et al. | 307/475 |

FOREIGN PATENT DOCUMENTS

0142167 5/1985 European Pat. Off. .
0317144 5/1985 European Pat. Off. .

Primary Examiner—Edward P. Westin
Assistant Examiner—Andrew Sanders
Attorney, Agent, or Firm—W. James Brady; Richard L. Donaldson

[57] ABSTRACT

In one aspect of the present invention, a converter is provided comprising a capacitive coupling arranged to receive said input signal to be converter, and a conversion circuitry coupled to the capacitive coupling to produce the converted output signal. A biasing circuit is further arranged to facilitate a fast transition in the converted output signal in response to an active transition in the input signal.

17 Claims, 4 Drawing Sheets

APPARATUS AND METHOD FOR ECL-LIKE SIGNAL TO CMOS SIGNAL CONVERSION

This application is a continuation of application Ser. No. 07/976,717, filed Nov. 16, 1992 now abandoned which is a continuation of Ser. No. 07/722,991, filed Jun. 28, 1991 now abandoned.

TECHNICAL FIELD OF THE INVENTION

This invention relates in general to the field of microelectronic circuits. More particularly, the present invention relates to apparatus and a method for ECL-like signal to CMOS signal conversion.

BACKGROUND OF THE INVENTION

Figure 1:
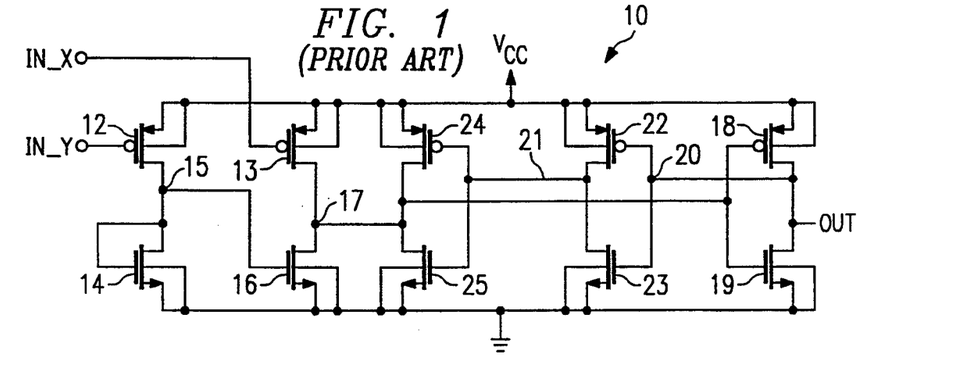
FIG. 1 is a schematic of a conventional conversion circuit employing a current mirror approach.

In integrated circuit design, the engineer may sometimes desire to incorporate circuits of different logic families into the same integrated circuit. For example, a design may include a CMOS (complementary metal oxide silicon) circuit which must use the output from an ECL-like (emitter-coupled logic) circuit to perform additional functions. Due to the inherent differences in signal characteristics of the logic families, a conversion must take place at the interface of the two logic family circuits. The present invention is concerned with the conversion of an ECL-like signal typically having characteristics of low swing and large common mode range.

one conventional circuit for ECL-like signal to CMOS signal conversion uses current mirrors, an example of which is shown in FIG. 1. Conventional circuit 10 receives ECL-like signals IN_X and IN_Y at the gates of pMOS 13 and 12, respectively. In operation, if input signal IN_Y is low (and input signal IN_X is high, since IN_X and IN_Y are complementary of one another), then pMOS 12 is turned on, and node 15 is pulled high to approximately $V_{CC}$. This in turn switches nMOS 16 on, which pulls node 17 to ground or low. Node 17 is coupled to the gate inputs of a pMOS 18 and an nMOS 19, which in effect forms an inverter. Therefore, the OUT signal from the conversion circuit 10 is inverted to high. A feedback path is formed to couple the output signal OUT to node 20 or the gates of a pMOS 22 and an nMOS 23 interconnected to function as an inverter. The output of the inverter formed by pMOS 22 and nMOS 23, node 21, is coupled to the input of another inverter composed of pMOS 24 and nMOS 25, the output of which is coupled to node 17. Therefore, the high OUT signal is converted to low by MOSFET pair 22 and 23, and then inverted again by MOSFET pair 24 and 25 to high. This effectively pulls node 17 back up.

There are at least three problems associated with conventional circuit 10. First, circuit 10 receives both input signals IN_X and IN_Y at the gates of two pMOS 13 and 12, respectively. Therefore, because the common mode range of ECL-like input signals IN_X and IN_Y can be near $V_{CC}$, circuit 10 would not function properly if the low level of ECL-like input signals IN_X and IN_Y is too high to turn pMOS 12 and 13 on. For example, if $V_{CC}$ is five volts, then the "low" level of IN_X and IN_Y has to be less than or equal to four volts, or one volt below the $V_{CC}$ voltage level in order for pMOS 12 and 13 to respond. As a result, low ECL-like signals that are too high to be detected by pMOS 12 and 13 are simply ignored.

A second problem arises from the peculiarity of ECL-like signals which results in high and extremely variable power consumption. High power consumption results if input signals IN_X and IN_Y are not truly complementary and the high level signals are at too low a voltage level, which may cause both input MOSFETS 12 and 13 to be on simultaneously. To overcome this problem additional circuitry is required to match the high and low voltage levels of IN_X and IN_Y to the threshold voltage levels of pMOS 12 and 13 over a predetermined temperature range. However, the voltage level matching function is typically not performed because of the time delay and addition to circuit size involved.

A third problem arises from the variance of the threshold voltage level of pMOS 12 and 13 over temperature and process variations. For example, as temperature rises, the threshold voltage of the MOSFETS decreases, leading to an increase in current flowing through a "weaker" component. Additionally, the threshold voltage of MOSFETS may vary greatly with weak and strong processing, thus directly affecting the operations of circuit 10.

Therefore, a need has arisen for a conversion circuit and method which receive at least one input signal having characteristics typical of an ECL signal, and convert it to at least one output signal having characteristics typical of a CMOS signal, that substantially eliminate the above-described problems associated with prior converters. Additionally, it is desirable to provide an ECL-like signal to CMOS signal conversion circuit that produces a two-phase output.

SUMMARY OF THE INVENTION

In accordance with the present invention, apparatus and a method for ECL-like signal to CMOS signal conversion are provided which substantially eliminate or reduce disadvantages and problems associated with prior circuits.

In one aspect of the present invention, a converter is provided comprising a capacitive coupling arranged to receive said input signal to be converter, and a conversion circuitry coupled to the capacitive coupling to produce the converted output signal. A biasing circuit is further arranged to facilitate a fast transition in the converted output signal in response to an active transition in the input signal.

An important technical advantage of the present invention is the relative insensitivity of circuit functions temperature and/or semiconductor processing variations compared with conventional converters.

Another important technical advantage is the heightened sensitivity to logic transitions in the input signals to be converted.

A further technical advantage arises from reduced and relatively stable circuit power consumption as compared with conventional circuits.

BRIEF DESCRIPTION OF THE DRAWINGS

For a better understanding of the present invention, reference may be made to the accompanying drawings, in which.

DETAILED DESCRIPTION OF THE INVENTION

Figure 2A:
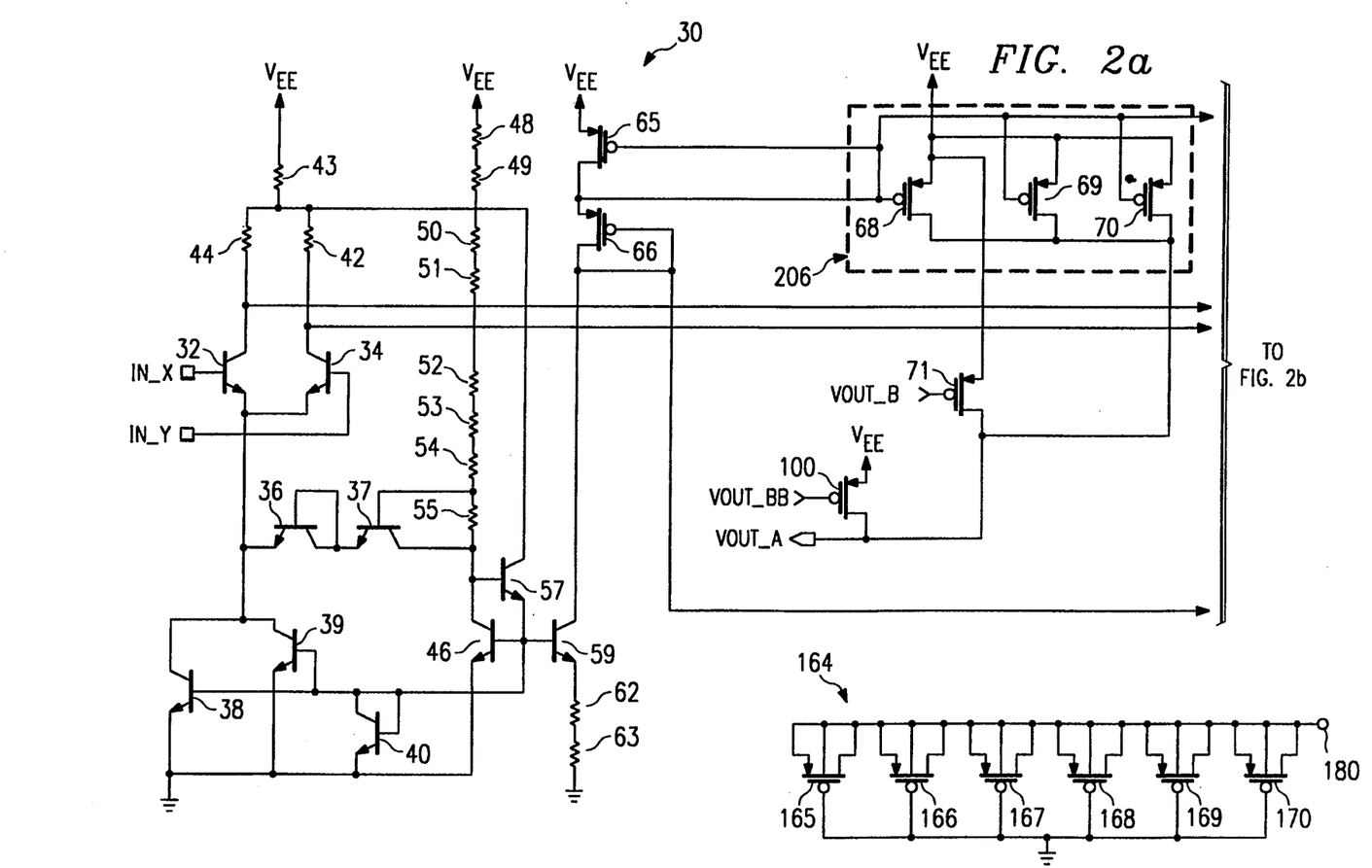
FIGS. 2a–2c are a detailed schematic of a preferred embodiment of the low swing ECL-like signal to CMOS signal conversion circuit constructed in accordance with the preferred embodiment of the present invention.
Figure 2B:
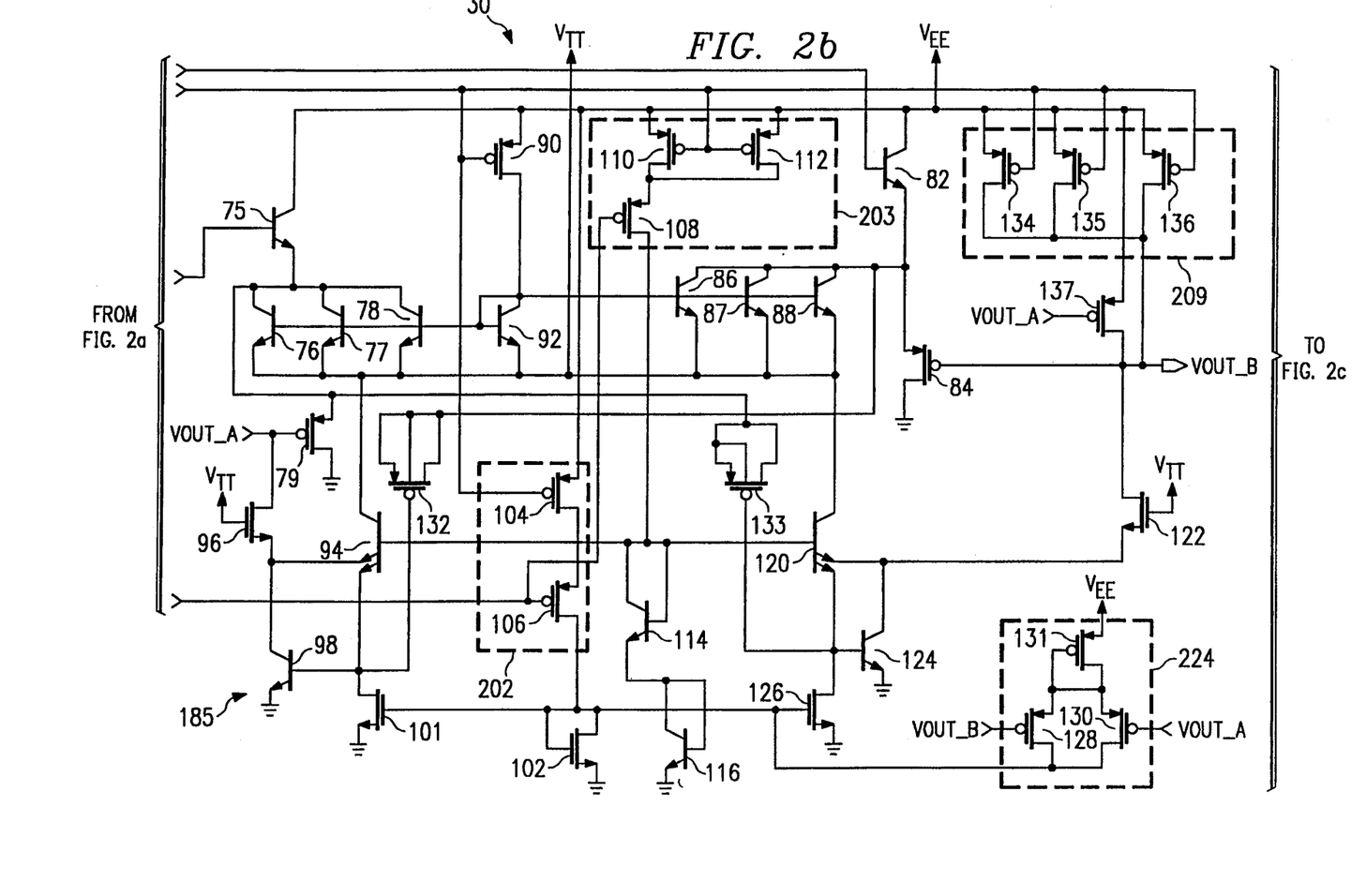
Figure 2C:
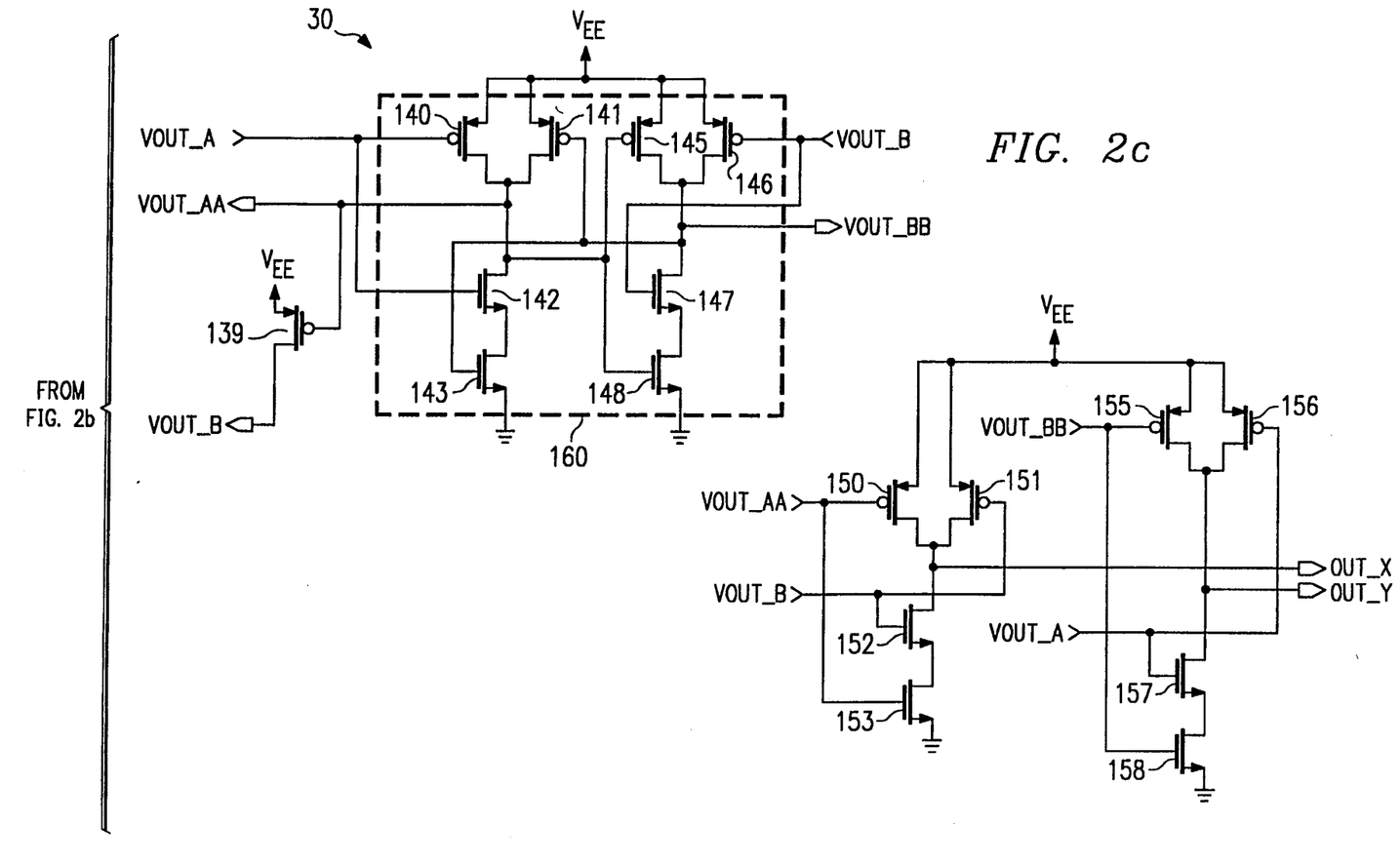

With reference to the drawings, FIGS. 2a-2c illustrate a detailed schematic of a preferred embodiment of the ECL-like signal to CMOS signal conversion circuit, indicated generally at 30 and constructed according to the teaching of the present invention. As shown in FIG. 2a, circuit 30 receives ECL-like input signals IN_X and IN_Y at the base terminals of differential input transistors 32 and 34, respectively. The emitter terminals of transistors 32 and 34 are coupled together and further coupled to serially connected transistors 36 and 37, where the emitter terminal of transistor 36 is coupled to the emitter terminals of transistors 32 and 34. The base and collector-shorted terminals of transistors 36 are connected to the emitter of transistor 37, and the collector of transistor 37 is coupled to a temperature compensating resistive biasing network which is described in detail below. The emitters of transistors 32 and 34 are further coupled to the collector terminals of parallel transistors 38 and 39, the emitters of which are coupled to ground. The base of transistor 38 is coupled to the base of transistor 39 and further coupled to the base and collector of a diode-connected transistor 40, the emitter of which is coupled to ground.

The collector terminals of differential input transistors 32 and 34 are coupled to parallelly-coupled resistors 44 and 42, respectively. Resistors 42 and 44 are further coupled in series with a resistor 43, the other terminal of which is coupled to $V_{EE}$. The collector of a transistor 46 is further coupled to $V_{EE}$ through a series of resistors 48-55 forming a temperature-compensating resistive biasing network. The emitter of transistor 46 is connected to ground. The collector of transistor 46 is coupled to the collector of transistor 37 and further coupled to the base of a transistor 57, the emitter of which is coupled to the base of transistor 46. The collector of transistor 57 is further coupled to resistors 42-44. Resistor 55 is further coupled between the base and collector terminals of transistor 37. The base of transistor 46 is further coupled to the collector and base of transistor 40. The base of transistor 46 is also coupled to the base of a transistor 59, the emitter of which is coupled to resistors 62 and 63, which are connected in series to ground. Further coupled to transistor 59 are pMOS 65 and 66, where the drain and gate of pMOS 66 are connected to the collector of transistor 59, and the drain and gate of pMOS 65 is connected to the source of pMOS 66. The source of pMOS 65 is coupled to $V_{EE}$. The circuit elements and connectivities described above form a biasing network that provides the proper current and voltage biasing required for the conversion section of converter 30, described in detail below.

A current source is formed by four pMOS 68-71 coupled in parallel between $V_{EE}$ and an intermediate output node VOUT_A. The gate of pMOS 71 is coupled to a second intermediate output VOUT_B. The gates of pMOS 68-70 are connected to the gate and drain of pMOS 65.

Referring also to FIG. 2b, further coupled to the collector of transistor 34 is the base of transistor 75, the collector of which is coupled to $V_{EE}$. The emitter of transistor 75 is coupled to the collectors of three transistors 76-78 which are coupled in parallel with their bases, emitters and collectors connected together. The emitter of transistor 75 is further coupled to the source of a pMOS 79, the drain of which is coupled to ground. The gate of pMOS 79 is coupled to receive intermediate output VOUT_A.

Similarly, the collector of transistor 32 is coupled to the base of a transistor 82, the collector of which is coupled to $V_{EE}$ and the emitter of which is coupled to the source of a pMOS 84. The drain of pMOS 84 is coupled to ground. Furthermore, the emitter of transistor 82 is coupled to the collector terminals of three parallelly-coupled transistors 86-88, the emitters of which are coupled together to the emitters of transistors 76-78. The collectors and bases of transistors 86-88 are further coupled together.

The source of a pMOS 90 is coupled to $V_{EE}$, the gate of which is coupled to the gates of pMOS 68-70. The drain of pMOS 90 is further coupled to the collector-base of a diode-coupled transistor 92, the emitter of which is coupled to the emitters of transistors 76-78 and 86-88. The base terminals of transistors 76-78 and transistors 86-88 are coupled to a common point formed by the base and collector of transistor 92.

The emitters of transistor 76-78 and 86-88 are further coupled to the collector of a multi-emitter transistor 94. The first emitter of transistor 94 is coupled to the source of an nMOS 96, the drain of which is coupled to the gate of pMOS 79 and intermediate output VOUT_A. The second emitter of transistor 94 is coupled to the base of a transistor 98, the collector of which is coupled to the source of nMOS 96. The emitter of transistor 98 is coupled to ground. The gate of nMOS 96 is coupled to a reference voltage level, $V_{TT}$. In the preferred embodiment of the present invention, reference voltage level $V_{TT}$ is set at three volts. A pMOS 100 (FIG. 2a) is coupled between $V_{EE}$ and intermediate output node VOUT_A, where its gate is coupled to a latched output VOUT_BB of intermediate output VOUT_B.

The second emitter of transistor 94 is further coupled to the drain of an nMOS 101, the source of which is coupled to ground, and the gate of which is coupled to the gate of an nMOS 102. The gate of nMOS 102 is shorted to its own drain and the source of nMOS 102 is connected to ground. Coupled between $V_{EE}$ and the drain of nMOS 102 are serially connected pMOS 104 and 106. The gate of pMOS 104 is coupled to the gates of pMOS 65, 68-70 and 90. The gate of pMOS 106 is coupled to the gate of pMOS 66 and also the gate of a pMOS 108. The source of pMOS 108 is coupled to the drains of pMOS 110 and 112, the gates of which are connected together and also coupled to the gates of pMOS 65, 68-70 and 90. The sources of pMOS 110 and 112 are coupled to $V_{EE}$. The drain of pMOS 108 is coupled to the base of multi-emitter transistor 94 and also to the collector and base terminals of a transistor 114. The emitter of transistor 114 is coupled to the base of a transistor 116, which is shorted to its collector. The emitter of transistor 116 is coupled to ground.

The emitter terminals of transistors 76-78 and 86-88 are further coupled to the collector of another multi-emitter transistor 120, the base of which is coupled to the base of transistor 114 and multi-emitter transistor 94. The first emitter of transistor 120 is coupled to the source of an nMOS 122, which is also coupled to the collector of a transistor 124. The drain of nMOS 122 is coupled to intermediate output VOUT_B. The gate of nMOS 122 is coupled to $V_{TT}$. The emitter of transistor 124 is coupled to ground and the base of transistor 124 is coupled to the second emitter of transistor 120 and further coupled to the drain of an nMOS 126, the source of which is coupled to ground.

nMOS 126 is coupled to a biasing circuit. The gate of nMOS 126 is coupled to the drains of pMOS 106 and nMOS 102 and further coupled to the drains of pMOS 128 and 130. The sources of both pMOS 128 and 130 are coupled to the drain of another pMOS 131, the source of which is coupled to $V_{EE}$. The gate of pMOS 131 is shorted to its own drain. The gate of pMOS 128 is coupled to receive second intermediate output VOUT_B and the gate of pMOS 130 is coupled to receive first intermediate output VOUT_A.

Three pMOS 134–136 function as another current source and are coupled in parallel between $V_{EE}$ and second intermediate output node VOUT_B. The gates of pMOS 134–136 are coupled to the gates of pMOS 65, 68–70 and 90. The source of a pMOS 137 is further coupled to the sources of pMOS 134–136 and the drain of pMOS 137 is coupled to the gate of pMOS 84. The gate of pMOS 137 is further coupled to intermediate output node VOUT_A.

Referring also to FIG. 2c, the drain of a pMOS 139 is further coupled to the drain of pMOS 137 and the gate of pMOS 84 The source of pMOS 139 is coupled to $V_{EE}$, the gate of which is coupled to a latched output VOUT_AA of intermediate output VOUT_A and further coupled to the interconnected drains of pMOS 140 and 141. The gate of pMOS 140 is coupled to VOUT_A and the gate of an nMOS 142, while the gate of pMOS 141 is coupled to VOUT_BB and the gate of an nMOS 143. The sources of pMOS 140 and 141 are coupled to $V_{EE}$. nMOS 142 and 143 are coupled in series where the drain of nMOS 142 is coupled to the drains of pMOS 140 and 141, the source of nMOS 142 is coupled to the drain of nMOS 143, and the source of nMOS 143 is connected to ground. Note that MOSFETs 140–143 form a two-input NAND gate where the output is provided as VOUT_AA.

A second two-input NAND gate is also formed by MOSFETs 145–148. The output of the NAND gate formed by MOSFETs 140–143 is coupled to the gates of pMOS 145 and nMOS 148. Intermediate output VOUT_B is further coupled to the gates of pMOS 146 and nMOS 147. The drains of pMOS 145 and 146 are connected together and further coupled to the drain of nMOS 147. The source of nMOS 147 is coupled to the drain of nMOS 148, the source of which is coupled to ground. Latched output VOUT_BB is provided at the drains of pMOS 145–147. Note that the NAND gates described above form an SR latch, latching intermediate output signals VOUT_A and VOUT_B and providing latched output signals VOUT_AA and VOUT_BB, respectively.

A third two-input NAND gate is further formed by MOSFETs 150–153, where pMOS 150 and 151 are connected in parallel between $V_{EE}$ and serially connected nMOS 152 and 153. The gates of pMOS 150 and nMOS 153 are coupled to signal VOUT_AA, and the gates of pMOS 151 and nMOS 152 are coupled to signal VOUT_B. The output of the NAND gate is the converted CMOS signal output OUT_X. A fourth NAND gate is formed by MOSFETs 155–158. pMOS 155 and 156 are coupled in parallel between $V_{EE}$ and serially coupled nMOS 157 and 158. The gates of pMOS 155 and nMOS 158 are coupled to signal VOUT_BB, and the gates of pMOS 156 and nMOS 157 are coupled to signal VOUT_A. The output of this NAND gate is the converted CMOS signal output OUT_Y.

Lastly, a reference voltage filtering capacitance 164 is provided by pMOS devices 165–170 coupled in parallel between a node 180 and ground. Note that node 180 is shown in FIG. 2a between resistor 43 and resistors 44 and 42.

Figure 3:
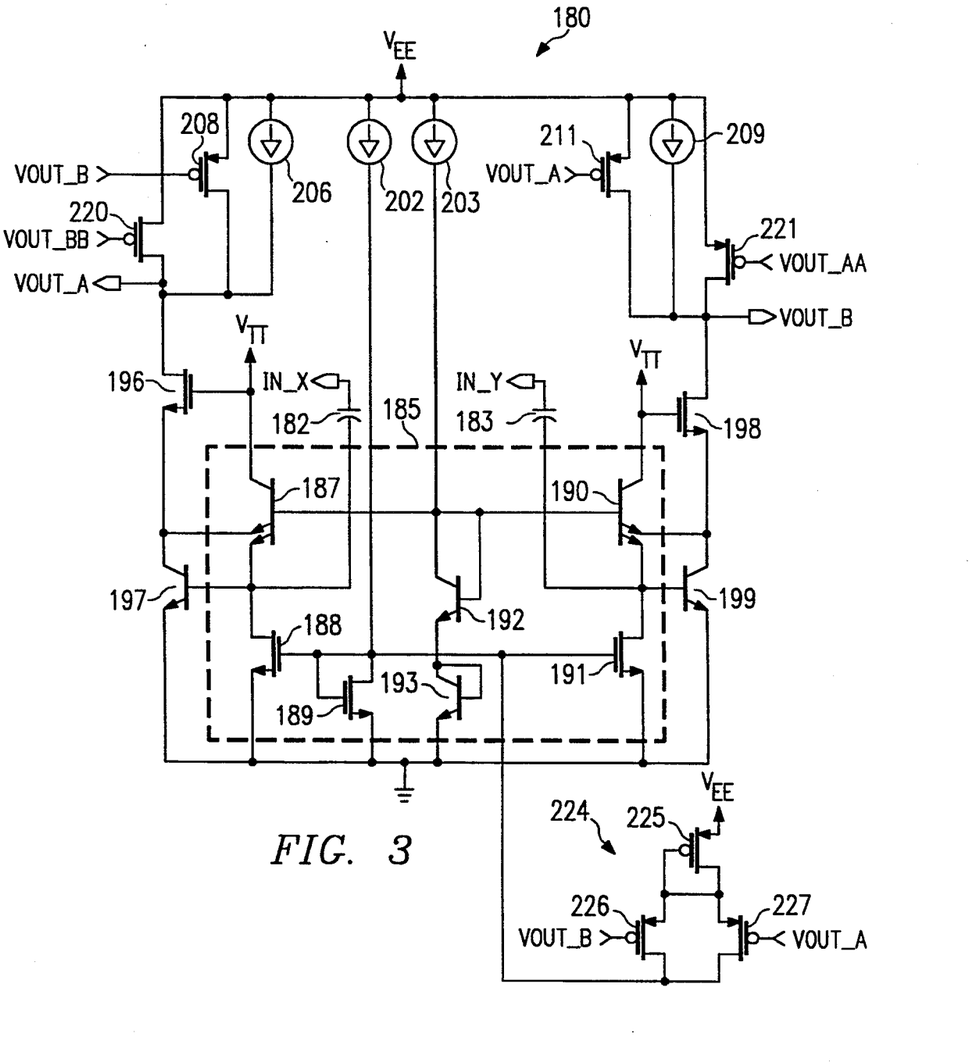
FIG. 3 is a simplified schematic of the present invention illustrative of its operation.

Referring to FIG. 3, a simplified circuit 180 of the preferred embodiment of the present invention is shown. ECL-like input signals IN_X and IN_Y are received by capacitors 182 and 183, respectively, which are coupled to a conversion portion 185 of circuit 180. Capacitor 182 is coupled to one emitter terminal of a multi-emitter transistor 187 and to the drain of an nMOS 188, the gate of which is coupled to ground. The gate of nMOS 188 is coupled to the drain of an nMOS 189, its drain being shorted to its gate. The source of nMOS 189 is coupled to ground. The base of multi-emitter transistor 187 is coupled to the base of another multi-emitter transistor 190, one emitter of which is also coupled to ground through an nMOS 191. The gate of nMOS 191 is coupled to the gate of nMOS 188. The collector of multi-emitter transistor 187 is coupled to $V_{TT}$, which is a reference voltage level that may be three volts. The gate of nMOS 191 is coupled to the gate of nMOS 188.

The bases of both multi-emitter transistors 187 and 190 are coupled to ground through two serial diode-coupled transistors 192 and 193. The collector of multi-emitter transistor 190 is coupled to reference voltage $V_{TT}$. The other emitter of transistor 187 is coupled to the source of an nMOS 196, the gate of which is coupled to $V_{TT}$. The source of nMOS 196 is further coupled to the collector of a transistor 197, the emitter of which is coupled to ground. The base of transistor 197 is coupled to one emitter of multi-emitter transistor 187 and the drain of nMOS 188, which are both coupled to capacitor 182. The drain of nMOS 196 consists of output VOUT_A.

For the portion of the circuit conversion of input ECL-like signal IN_Y, the gate of an nMOS 198 is coupled to reference voltage level $V_{TT}$. The source of nMOS 198 is coupled to the second emitter of multi-emitter transistor 190 and to the collector of a transistor 199. The base of transistor 199 is coupled to the drain of nMOS 191 and further coupled to capacitor 183, which receives signal IN_Y. The emitter of transistor 199 is coupled to ground.

Biasing in converter circuit 180 is partially provided by current sources 202 and 203 coupled to the gate-drain of nMOS 189 and the diode-coupled transistor 192 and 193, respectively. A third current source 206 is coupled between $V_{EE}$ and the drain of pMOS 208 and provides a signal VOUT_A. pMOS 208 receives signal VOUT_B at its gate and its source is coupled to $V_{EE}$. The counterpart for converting ECL-like signal IN_Y further includes a current source 209 coupled between $V_{EE}$ and signal VOUT_B and the drain of nMOS 198. The drain of nMOS 198 is further coupled to the drain of a pMOS 211, the gate of which receives signal VOUT_A. The source of pMOS 211 is coupled to $V_{EE}$. Also coupled to VOUT_B is the drain of a pMOS 221. The gate of pMOS 221 receives signal VOUT_AA and the source thereof is coupled to $V_{EE}$. Similarly, a pMOS 220 is coupled between $V_{EE}$ and VOUT_A, the gate of which receives VOUT_BB.

The common node formed by the gates of nMOS 188, 189 and 191, and current source 202 is further coupled to an additional biasing circuit 224. Biasing circuit includes three pMOS 225–227, where pMOS 225 is coupled between $V_{EE}$ and the sources of pMOS 226 and 227 with its gate connected to its drain. The drains of pMOS 226 and 227 are coupled together and are further coupled to the common node formed by the gates of nMOS 188, 189 and 191. The gates of pMOS 226 and 227 receive signals VOUT_B and VOUT_A, respectively.

FIG. 3 serves to illustrate, in a simplified manner, the operations of the preferred embodiment of the present invention 30. Converter 30, shown as simplified circuit 180 in FIG. 3, is biased so that intermediate output signals, VOUT_A and VOUT_B, are normally high. Biasing is achieved by a biasing circuit having various current sources 202, 203, 206 and 209, and a biasing network 185 consisting of transistors 187, 190, 192, 193, and nMOS 188, 189, and 191.

More specifically, in order to provide a fast high to low transition to occur at either of the outputs, VOUT_A and VOUT_B, small bias currents of approximately 50 µA each, for example, are provided to flow through transistors 197 and 199. Bias currents through transistors 197 and 199 are achieved by setting up a current, preferably 25 µA, through transistors 192 and 193. A voltage level of approximately $2V_{BE}$ arising from the base-to-emitter voltages of transistors 192 and 193 is then attained at the collector of transistor 192 and the base terminals of multi-emitter transistors 187 and 190. The amount of current flowing through transistors 199 and 197 may be modified by varying the area ratios between transistors 187 and 190 to transistor 192, and the area ratios between transistors 197 and 199 to transistor 193. Such biasing techniques are known in the art of transistor circuits.

Additional biasing is provided by nMOS 188 and 191 using nMOS 189 as a reference. nMOS 188-191 serve to stabilize the base-emitter junctions of multi-emitter transistors 187 and 190 by diverting to ground any additional current seen at output VOUT_A or VOUT_B after a low to high active transition has occurred. Circuit 224 serves to power up nMOS 188, 189 and 191 whenever an intermediate output VOUT_A or VOUT_B is active or low. Furthermore, nMOS 196 and 198 serve to eliminate current surge and miller-capacitive coupling on the collector terminals of transistors 197 and 199, respectively, as VOUT_A and VOUT_B recover from a high to low transition to return to a high logic level.

In operation, assume input signal IN_Y becomes high, thus coupling charge into capacitor 183 for capacitively storing the ECL-like signals. Note that capacitor 183 is representative of pMOS 133 in FIG. 2. The capacitive coupling causes current to flow into the base of transistor 199 and also causes the current that flows through transistor 199 to increase several orders of magnitude, for example, from 50 µA to approximately 5 mA. As transistor 199 is turned on, nMOS 198, its gate being coupled to reference voltage level $V_{TT}$ of preferably three volts, is turned on. This causes intermediate output signal VOUT_B to be pulled low to a clamped voltage level. As described above, the high to low transition of output signal VOUT_B occurs rapidly due to the biasing arrangement.

Multi-emitter transistor 190 serves to clamp the voltage level of VOUT_B to approximately 0.6 volts in the preferred embodiment of the present invention. Once VOUT_B is low, it turns pMOS 208 on, forcing the other intermediate output signal, VOUT_A, to the voltage level of $V_{EE}$, which is high or five volts in the preferred embodiment. In this manner, a two-phase output is achieved in intermediate output signals VOUT_A and VOUT_B. As circuit 180 is arranged symmetrically, discussions involving one input signal and the ensuing circuit operations is equally applicable to the other input signal and its counterpart circuit portions.

Assume in the present discussion that signals VOUT_AA and VOUT_BB are latched signals of VOUT_A and VOUT_B output signals, respectively. When a low transition is obtained on VOUT_B, pMOS 208 is turned on, which forces VOUT_A high. Similarly, VOUT_BB causes pMOS 220 to be turned on, which also forces VOUT_A high. When ECL-like input signal IN_Y experiences a high to low transition, VOUT_B is returned to a high voltage level by a circuit shown in FIGS. 2a–2c, discussed in detail below.

Returning to FIG. 2a–2c, the operation of converter 30 is further discussed in more detail. In operation, the common mode range of ECL-like input signals IN_X and IN_Y can be near $V_{CC}$ or ground. Therefore, the differential pair consisting of transistors 32 and 34 is used to convert signals IN_X and IN_Y to differential signals having a more controlled swing with a controlled edge rate.

Biasing is achieved by a number of circuit components. A reference current generation circuit includes resistors 48–55, and transistors 36–40, 46 and 57–59 are used to provide a reference current flow in pMOS 65 and 66. This reference current is mirrored and amplified by current source mirrors 206 composed of pMOS 68–70 for output VOUT_A and pMOS 134–136 for output VOUT_B. As shown, identical reference numerals are used to point to component functions in FIG. 3 and their preferred implementations in FIGS. 2a–2c. For example, current source 206 in FIG. 3 is shown implemented by pMOS 68–70 in FIG. 2a. Similarly, current source 202 is shown implemented by pMOS 104 and 106, current source 203 by pMOS 108–112, and current source 209 by pMOS 134–136.

Assume that input signal IN_Y falls, which causes the voltage on the collector of transistor 34 to rise. The rising voltage in turn pulls up the base of transistor 75 (FIG. 2b) and subsequently the emitter of transistor 75. The rise in voltage on the emitter of transistor 75 causes charge to build up in the capacitively coupled pMOS 133, forcing current into the base of transistor 124 and allowing current to flow from its collector to the emitter. nMOS 122 turns on, thus pulling down the voltage level at intermediate output signal VOUT_B to a predetermined clamp voltage level. In the preferred embodiment, the clamp level is approximately 0.6 volt and is accomplished by a biasing network composed of transistors 94, 114, 116, 120 and nMOS 101, 102 and 126 as described above. With intermediate output signal VOUT_B at a voltage level of 0.6 or a low logic level, pMOS 71 turns on, causing the voltage level of VOUT_A to equal approximately five volts or a high logic level. The low logic level of VOUT_B also turns pMOS 146 on, causing VOUT_BB to be high. Similarly, the high logic level of VOUT_A and the high VOUT_BB cause the logic level of VOUT_AA to be low. The combination of the resultant logic levels of VOUT_A, VOUT_B, VOUT_AA, and VOUT_BB, (high,low,low,high), in turn causes nMOS 157 and 158 to pass a low logic level to OUT_Y, and pMOS 150 or 151 to pass a high logic level to OUT_X.

After input IN_Y has become low and then experiences a low to high transition, additional biasing is provided to enable a quick corresponding low to high transition at the output OUT_Y. For example, when IN_Y rises and the voltage level at the base of transistor 75 also falls, it is desirable to drop the voltage level at the emitter of transistor 75, which couples into gate capacitor 133. In the preferred embodiment, the voltage level at the emitter of transistor 75 is pulled low by transistors 76–78 (transistors 86–88 to pull the emitter of transistor 82 low), which in effect mirror and amplify the current through pMOS 90 and transistor 92. The current through pMOS 90 and transistor 92 is in turn set up by the reference current generation circuit, including pMOS 65 and 66.

Filtering of input signals IN_X and IN_Y to rid them of noise is performed by an RC filter, which is composed of resistor 43 and gate capacitors or pMOS 165–170. In the preferred embodiment of the present invention, a second RC filter (not shown) is installed at a node common to the base of transistors 38 and 39 and the collector and base of transistor 40 to eliminate false signal transitions.

Although the present invention has been described in detail, it should be understood that various changes, substitutions and alterations can be made thereto without departing from the spirit and scope of the present invention as defined by the appended claims.

What is claimed is:

1. A converter for converting at least one input signal having small logic transitions to at least one output signal having substantially larger and more defined logic transitions, comprising:
    a capacitive coupling comprising a capacitor having a first terminal receiving said input signal and a second terminal
    conversion circuitry connected to said second terminal to produce said output signal having substantially larger logic transitions in response to substantially smaller logic transitions in said input signal; and
    a biasing circuit coupled to said capacitive coupling and said conversion circuitry for facilitating fast logic transitions in said output node in response to corresponding logic transitions in said input signal;
    wherein said conversion circuitry comprises a switching and amplifying circuit having an input coupled to said capacitive coupling and an output coupled to said biasing circuit.

2. The converter, as set forth in claim 1, wherein said capacitor comprises a MOSFET having a drain, source and gate, said drain shorted to its source and further coupled to a bulk of said MOSFET, said gate of said MOSFET coupled to said conversion circuitry.

3. The converter, as set forth in claim 2, wherein said MOSFET is a p-channel MOSFET.

4. The convertor, as set forth in claim 1, wherein said conversion circuitry comprises a switching and amplifying circuit having an input connected to said second terminal and an output coupled to said biasing circuit.

5. The converter, as set forth in claim 1, wherein said switching and amplifying circuit comprises a first transistor having a base coupled to said capacitive coupling and further coupled to said biasing circuit, and an emitter coupled to ground, and a collector providing said output signal.

6. The converter, as set forth in claim 5, wherein said biasing circuit comprises:
    a current source producing a first current; and
    a first current mirror coupled to said current source and said conversion circuitry and adapted to produce and supply a second current to said switching and amplifying circuit in response to receiving said first current from said current source.

7. The converter, as set forth in claim 5, wherein said biasing circuit comprises a voltage clamping circuit coupled to said collector of said first transistor and adapted for limiting the voltage level on said collector.

8. The converter, as set forth in claim 7, further comprising an n-channel MOSFET coupled to said collector of said first transistor adapted for limiting miller coupling of said first transistor.

9. The converter, as set forth in claim 6, wherein said first current mirror comprises:
    a diode-coupled transistor coupled to said current source and adapted to receive said first current; and
    a multi-emitter transistor having at least two emitters and a base, said base coupled to said diode-coupled transistor, one of said emitters coupled to said collector of said first transistor, and one of said other emitters coupled to said base of said first transistor.

10. The converter, as set forth in claim 7, wherein said biasing circuit further comprises:
    a reference current generating circuit coupled to said capacitive coupling for generating a reference current; and
    a current mirror coupled to said reference current generating circuit and adapted to mirror and amplify said reference current to provide an amplified current to said collector of said multi-emitter transistor.

11. The converter, as set forth in claim 10, wherein said reference current generating circuit includes:
    at least one resistive element producing said reference current;
    a second current mirror coupled to said resistive element and reproducing said reference current.

12. The converter, as set forth in claim 1, further comprising a latching circuit coupled to said conversion circuitry and adapted to latch said produced output signal.

13. The converter, as set forth in claim 1, wherein said input signal is produced by a circuit producing an ECL-like signal and said output signal is adapted to be received by a CMOS circuit.

14. A converter for converting two differential ECL-like input signals to two differential CMOS output signal, the converter comprising:
    a differential pair receiving said differential ECL-like input signals and producing a pair of differential signals;
    circuitry responsive to said pair of differential signals for producing a pair of first signals;
    two capacitive couplings coupled to said circuitry responsive to said pair of differential signals and each arranged to receive one of said pair of first signals;
    conversion circuitry connected to both said capacitive couplings adapted to produce two differential CMOS output signals having substantially larger and more defined logic transitions in response to said differential ECL-like input signals having smaller logic transitions; and
    a biasing circuit coupled to said capacitive couplings and said conversion circuitry for facilitating fast logic transitions in said differential CMOS output signals in response to corresponding logic transitions in said differential ECL-like input signals.

15. A method for interfacing a circuit producing at least one ECL-like signal and a CMOS circuit, said ECL-like signal to be received by said CMOS circuit, the method comprising the steps of:

receiving said ECL-like signal and capacitively storing said ECL-like signal in response to a logic transition in said ECL-like signal;

detecting said capacitive storage and producing an output signal having a corresponding logic transition like that produced by a CMOS circuit; and providing bias so that said detecting and producing step is performed substantially spontaneously.

16. The converter of claim 14, in which said circuitry responsive to said pair of differential signals includes a first transistor, said first transistor having a base for receiving one of said pair of first signals, a collector coupled to a voltage source, and an emitter coupled to one of said capacitive couplings.

17. The converter of claim 16, in which said circuitry responsive to said pair of differential signals includes a second transistor, said second transistor having a base for receiving the other of said pair of first signals, a collector coupled to said voltage source, and an emitter coupled to the other of said capacitive couplings.

* * * * *